(12) United States Patent
Chou et al.

(10) Patent No.: US 7,462,545 B2
(45) Date of Patent: Dec. 9, 2008

(54) SEMICONDUTOR DEVICE AND MANUFACTURING METHOD THEREOF

(75) Inventors: Jih-Wen Chou, Hsinchu (TW); Chih-Hsun Chu, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 323 days.

(21) Appl. No.: 11/162,727

(22) Filed: Sep. 21, 2005

(65) Prior Publication Data
US 2007/0012994 A1    Jan. 18, 2007

(30) Foreign Application Priority Data
Jul. 13, 2005    (TW) .............................. 94123681 A

(51) Int. Cl.
*H01L 21/336*    (2006.01)
(52) U.S. Cl. ...................... 438/300; 438/303
(58) Field of Classification Search ................ 257/288, 257/623, E29.267; 438/300, 303, 696, 702
See application file for complete search history.

(56) References Cited
U.S. PATENT DOCUMENTS 6,960,785 B2 * 11/2005 Jin et al. ........................ 257/57
2002/0142551 A1 * 10/2002 Park et al. .................... 438/300
2003/0234422 A1 * 12/2003 Wang et al. .................. 257/336

* cited by examiner

*Primary Examiner*—M. Wilczewski
*Assistant Examiner*—Toniae M. Thomas
(74) *Attorney, Agent, or Firm*—Jianq Chyun IP Office

(57) ABSTRACT

A semiconductor device is provided. The semiconductor device has a gate structure, a source region, a drain region, and a pair of dielectric barrier layers. The gate structure is formed on a substrate. The source region and the drain region are formed in the substrate next to the gate structure, and a channel region is formed between the source region and the drain region underneath the gate structure. The pair of dielectric barrier layers is respectively formed in the substrate underneath the gate structure between the source region and the drain region. The dielectric barrier layers are used for reducing the drain induced barrier lowering effect in a nanometer scale device.

8 Claims, 8 Drawing Sheets

SEMICONDUTOR DEVICE AND MANUFACTURING METHOD THEREOF

CROSS-REFERENCE TO RELATED APPLICATION

This application claims the priority benefit of Taiwan application serial no. 94123681, filed on Jul. 13, 2005. All disclosure of the Taiwan application is incorporated herein by reference.

BACKGROUND OF THE INVENTION

1. Field of the Invention

The present invention relates to a semiconductor device and a fabrication method thereof. More particularly, the present invention relates to a metal oxide semiconductor device of nanometer scale and a fabrication method thereof.

2. Description of Related Art

As the level of integration of integrated devices increases, the dimensions of integrated devices decrease correspondingly. Accordingly, as the dimension of a metal oxide semiconductor (MOS) device is being reduced, the channel length also reduces. However, the dimension of the channel of a MOS transistor can not be unlimitedly reduced. As the channel length reduces to a certain degree, various problems gradually surface. The so-called short channel effect not only lowers the device threshold voltage (Vt) and creates the controlling problem of the MOS transistor by the gate voltage (Vg), the operation of the MOS transistor is also affected by the punch-through effect. Especially when the transistor dimension of a metal oxide semiconductor (MOS) device is further reduced to the nanometer scale, the short channel effect and the punch through effect would become more serious and a further size reduction of the semiconductor device is hindered.

Many studies have been done on approaches to suppress the short channel effect and the punch through effect. FIG. 1 is a cross-sectional view of a conventional semiconductor device.

Referring to FIG. 1, the semiconductor device is constructed with a substrate 100, a gate structure 102, a spacer 108, a source region 110 and a drain region 112, a lightly doped region 114 and a pocket implant region 116. The gate structure 102 is disposed above the substrate 100, and the gate structure 102 is constituted with a gate oxide layer 104 and a gate conductive layer 106. A spacer 108 is disposed on the sidewall of the gate structure 102. The source region 110 and the drain region are configured in the substrate 100 beside both sides of the gate structure 102. The light doped regions 114 are configured in the substrate 100 below the spacer 108, contiguous to the source region 110 and the drain region. The pocket implant region 116, also known as a halo implant region, is disposed under the light doped region 114. The dopant type of the pocket doped region 116 is different from the dopant type of the lightly doped region 114 and the source 110/drain 112 region in order to suppress the short channel effect and the punch through effect of the semiconductor device.

In the above semiconductor device, forming a doped region (pocket implant region) with a different dopant type from that of the light doped region under the light doped region 114 can suppress the short channel effect and the punch through effect of the semiconductor device. However, during the fabrication of such a semiconductor device, several thermal processes need to be conducted. As a result, the diffusion of the dopants in the pocket implant region occurs. The effectiveness on suppressing the short channel effect thereby diminishes. Moreover, forming the pocket implant region 116 and the lightly doped region 114 hampers a further size reduction of the semiconductor device and an increase of the level of integration.

SUMMARY OF THE INVENTION

At least one objective of the present invention is to provide a semiconductor device and a fabrication method thereof, wherein a dielectric barrier layer is disposed between the source region and the drain region to lower the electric field of the drain region and to mitigate the short channel effect.

At least another objective of the present invention is to provide a semiconductor device and a fabrication method thereof, wherein the formation of the lightly doped region and the pocket implant regions is obviated. The level of integration is thus increased. Accordingly, the present invention is applicable to nanometer scale devices.

The present invention provides a semiconductor device which includes a gate structure, a source region, a drain region and a pair of dielectric barrier layers. The gate structure is disposed on a substrate. The source region and the drain region are respectively configured in the substrate beside both sides of the gate structure, wherein a channel region is disposed underneath the gate structure between the source region and the drain region. The pair of dielectric barrier layers is respectively disposed in the substrate underneath the gate structure and between the source region and the drain region.

In the above semiconductor device, the pair of dielectric barrier layers can be contiguous to the gate structure or be separated from the gate structure with a distance. The pair of dielectric barrier layers comprises silicon oxide.

In the above semiconductor device, the pair of barrier layers is a multilayer structure, which may include a silicon oxide layer and a silicon nitride layer, wherein the silicon oxide layer is contiguous to the channel region. The silicon oxide layer is contiguous to the gate structure, while the silicon nitride layer and the gate structure are parted with a distance.

In the above semiconductor device, the gate structure includes a gate dielectric layer, a gate conductive layer and a cap layer. The sidewall of the gate structure is also disposed with a spacer.

Since a dielectric barrier layer in the above semiconductor device is disposed between the channel region and the source/drain region, the electric field of the drain region is lower to mitigate the short channel effect.

Moreover, in the above semiconductor device, the formations of a lightly doped region and a pocket implant region are precluded and the level of integration is increased. Since the dielectric barrier layer can diminish the drain induced barrier lowering (DIBL) effect in nanometer scale devices, the present invention is applicable to such devices.

Since the channel region is connected to the source/drain region through the gap between the gate structure and the dielectric barrier layer, the operating voltage can be lowered.

The present invention also provides a method for fabricating a semiconductor device, wherein a substrate is provided and a gate structure is formed thereon. Further using the gate structure as a mask, a portion of the substrate is removed to form an opening with a certain depth in the substrate beside both sides of the gate structure. A first dielectric barrier layer is then formed on the substrate exposed by the opening and a second dielectric barrier layer is formed on the sidewalls of the gate structure and the substrate underneath the gate structure. The first dielectric layer not covered by the second dielectric layer is then removed and forming a first semiconductive layer in the opening. The first semiconductive layer has a thickness which is smaller than the depth of the opening. The portion of the second dielectric layer higher than a portion of the surface of the first conductive layer is removed and forming a second semiconductive layer in the opening. Thereafter, a source region and a drain region are formed in the second semiconductive layer and the first semiconductive layer beside both sides of the gate structure.

According to the above fabrication method for a semiconductor device, after removing a portion of the second dielectric barrier layer that is higher than a portion of the surface of the first semiconductive layer, the method further includes removing a portion of the first dielectric barrier layer higher than the surface of the first conductive layer.

According to the above fabrication method for a semiconductor device, the material of the first dielectric barrier layer includes silicon oxide. The method used in forming the first dielectric barrier layer on the substrate exposed by the opening includes thermal oxidation or chemical vapor deposition.

According to the above fabrication method for a semiconductor device, the method used in forming the second dielectric barrier layer on the sidewall of the substrate under the gate structure and the gate structure includes forming a dielectric material layer on the substrate, followed by performing an anisotropic etching process to remove a portion of the dielectric material layer. The material of the second dielectric barrier layer includes silicon nitride.

In the above fabrication method for a semiconductor device, the material of the second semiconductive layer and the first semiconductive layer includes epitaxial silicon. The first semiconductive layer and the second semiconductive layer are formed by selective epitaxial growing.

The present invention provides a fabrication method for a semiconductor device, wherein a substrate is provided and a gate structure is formed on the substrate. Using the gate structure as a mask, an opening is formed in the substrate beside both sides of the gate structure. A dielectric barrier layer is then formed in the substrate under the gate structure, followed by forming a semiconductive layer in the opening.

In the above fabrication method for a semiconductor device, a material of the dielectric barrier layer include silicon oxide.

In the above fabrication method for a semiconductor device, the dielectric barrier layer formed on the sidewalls of the substrate underneath the gate structure is accomplished by, for example, forming a dielectric layer, followed by performing an anisotropic etching process to remove a portion of the dielectric layer.

In the above fabrication method for a semiconductor device, the semiconductive layer includes an epitaxial silicon material. Further, the semiconductive layer is formed by a selective epitaxial growing method.

In the above fabrication method for a semiconductor device, a dielectric barrier layer is formed between the source region and the drain region to lower the electric field of the drain region and to mitigate the short channel effect.

Moreover, the formation of a lightly doped region and a pocket implant region is precluded from the fabrication method of a semiconductor device of the present invention. Accordingly, the level of device integration is increased. Since the dielectric barrier layer can mitigate the drain induced barrier lowering (DIBL) effect induced by a nanometer scale device, the semiconductor device of the present invention is applicable to the nanometer scale device.

Additionally, in accordance with the fabrication method of the semiconductor device of the present invention, a portion of the dielectric barrier layer is further removed. The source/drain region and the channel region are connected together via the gap between the gate structure and the dielectric barrier layer. The operation voltage is thus lowered.

Several exemplary embodiments of the invention will now be described in detail with reference to the accompanying drawings. It is to be understood that the foregoing general description and the following detailed description of preferred purposes, features, and merits are exemplary and explanatory towards the principles of the invention only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
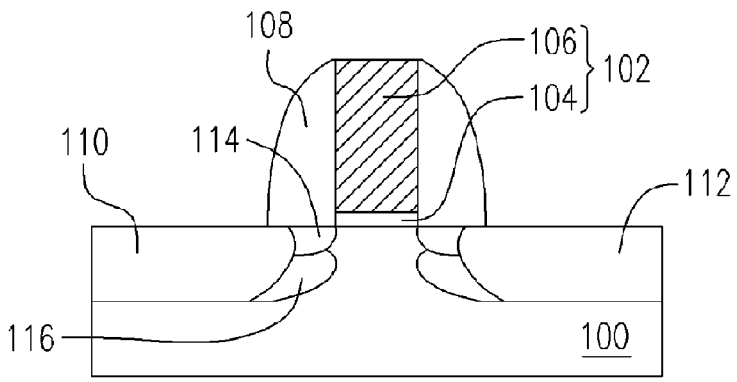
FIG. 1 is a schematic, cross-sectional diagram of a conventional semiconductor device.

Reference will now be made in detail to the present preferred embodiments of the invention, examples of which are illustrated in the accompanying drawings. Wherever possible, the same reference numbers are used in the drawings and the description to refer to the same or like parts. It is to be understood that both the foregoing general description and the following detailed description are exemplary, and are intended to provide further explanation of the invention as claimed.

Figure 2A:
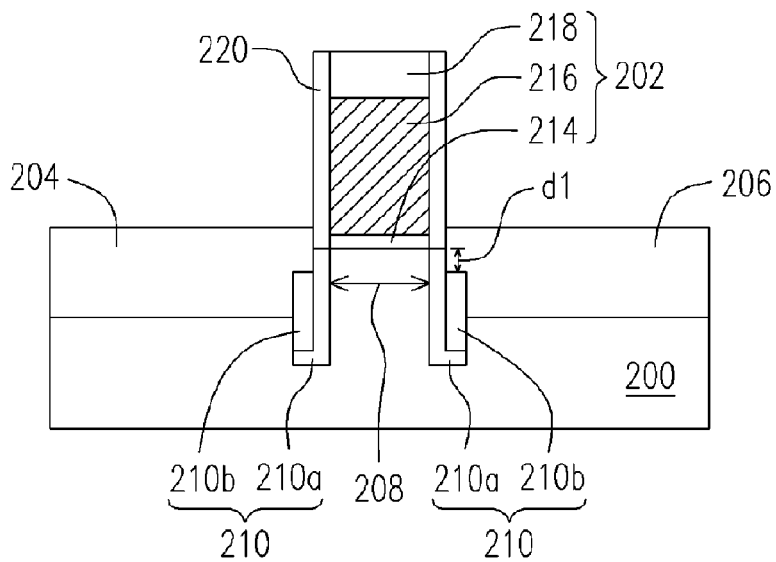
FIG. 2A is a schematic, cross-sectional diagram of a semiconductor device according to one embodiment of the present invention.

FIG. 2A is a schematic, cross-sectional diagram of a semiconductor device according to one embodiment of the present invention.

Referring to FIG. 2A, the semiconductor device of the present invention is constituted with at least a substrate 200, a gate structure 202, a source region 204, a drain region 206, and a dielectric barrier layer 210.

The gate structure 202 is disposed over a substrate 200. The gate structure 202 includes a gate dielectric layer 214, a gate conductive layer 216 and a cap layer 218. The gate dielectric layer 214 is formed with silicon oxide. The material of the gate dielectric layer 214 can also be other dielectric material commonly used for a gate dielectric layer. The gate conductive layer 216 is formed with but not limited to doped polysilicon. The material of the gate conductive layer 216 can also be metal or other conductive material. The material of the cap layer 218 includes an insulation material, such as silicon oxide or silicon nitride. The cap layer may also serve as a hard mask. Further, the cap layer 218 can be a single layer structure or a multi-layered structure.

The source region 204 and the drain region 206 are respectively disposed beside both sides of the gate structure in the substrate 200. A channel region 208 is configured under the gate structure 202 between the source region 204 and the drain region 206. The source region 204 and the drain region 206 are either an n-type doped region or a p-type doped region.

A pair of dielectric barrier layers 210 is respectively disposed underneath the gate structure 202 in the substrate 200 and between the source region 204 and the drain region 206. The dielectric barrier layers 210 can be a single-layered structure or a multi-layered structure. In the current embodiment, the dielectric barrier layers 210 are constituted with a dielectric barrier layer 210a and a dielectric barrier layer 210b. The dielectric barrier layer 210b and the gate structure 202 are separated by a distance of d1. The distance between the dielectric barrier layer 210b and the gate structure 202 can alleviate the drain induced barrier lowering (DIBL) effect on a nanometer scale device. If the dielectric barrier layer 210 is a single-layered structure, only the dielectric barrier layer 210a is required.

The sidewall of the gate structure can also be disposed with a spacer 220. The material of the spacer 220 includes but not limited to silicon oxide.

In the semiconductor device of the present invention, since a pair of the dielectric barrier layers 210 is disposed between the source region 204 and the drain region 206. The electric field of the drain region is lowered to mitigate the short channel effect. The semiconductor device of the present invention is thus precluded from forming the lightly doped region and the pocket implant region and the level of integration is increased. Since the dielectric barrier layer can alleviate the drain induced barrier lowering effect of a nanometer scale device, the semiconductor device of the present invention is applicable to a nanometer scale device.

Figure 2B:
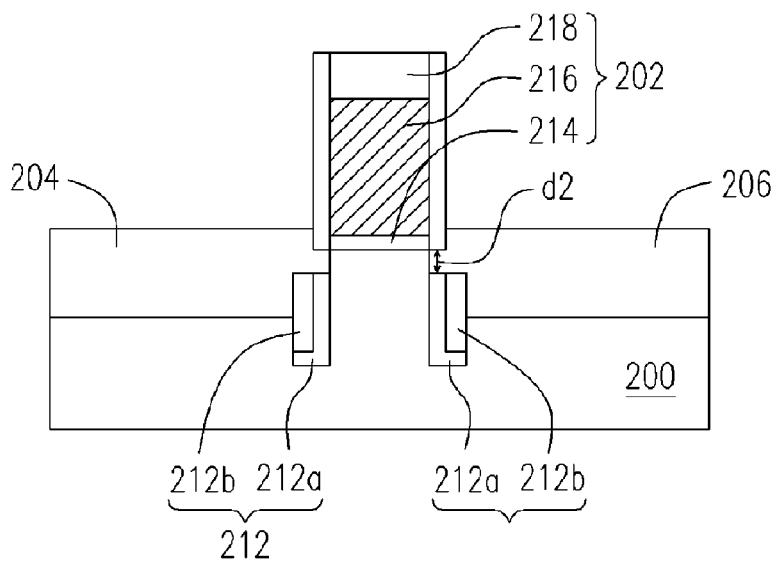
FIG. 2B is a schematic, cross-sectional diagram of a semiconductor device according to another embodiment of the present invention.

FIG. 2B is a schematic, cross-sectional diagram of a semiconductor device according to another embodiment of the present invention. In FIG. 2B, the same reference numbers are used to refer to the same parts in FIG. 2A.

Comparing the semiconductor device in FIG. 2B with the semiconductor device in FIG. 2A, the difference is the dielectric barrier layer disposed under the gate structure 202 in the substrate 200 between the source region 204 and the drain region 206. The following disclosure is directed to the difference between the semiconductor device in FIG. 2B and the semiconductor device in FIG. 2A.

Referring to FIG. 2B, in the semiconductor device of the present embodiment, a pair of dielectric barrier layers 212 is respectively disposed in the substrate 200 under the gate structure 202 and between the source region 204 and the drain region 206. In the present embodiment, the dielectric barrier layers are constituted with, for example, a dielectric barrier layer 212a and a dielectric barrier layer 212b. The dielectric barrier layer 212b is disposed between the dielectric layer 212a and the source region and between the dielectric barrier layer 212a and the drain region. The dielectric barrier layers 212 (includes the dielectric barrier layer 212a and the dielectric barrier layer 212b) and the gate structure 202 are separated by a distance d2, for example. In other words, the channel region 208 of the semiconductor device and the source 204/drain 206 region are not completely blocked by the dielectric barrier layers 212. The channel region 208 and the source 204/drain 206 region are connected together through the gap between the gate structure 202 and the dielectric barrier layers 212. If the pair of dielectric barrier layers 212 is a single layer structure, only the dielectric barrier layer 212a is required.

Figure 2C:
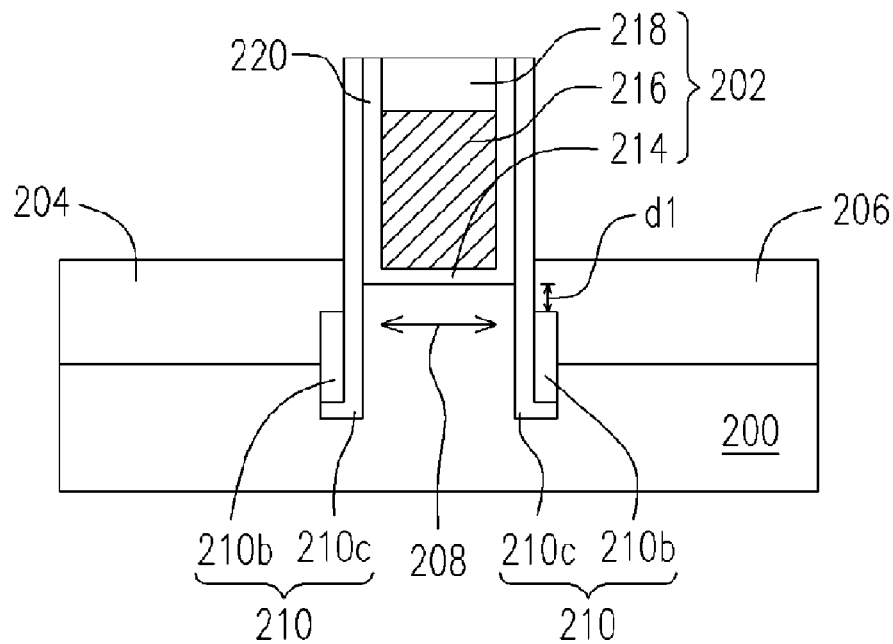
FIG. 2C is a schematic, cross-sectional diagram of a semiconductor device according to still another embodiment of the present invention.

FIG. 2C is a schematic, cross-sectional diagram of a semiconductor device according to still another embodiment of the present invention. In FIG. 2C, the same reference numbers are used to refer to the same parts in FIG. 2A.

Comparing the semiconductor device in FIG. 2C with that in FIG. 2A, the difference between the two devices is the dielectric barrier layer 210. The following disclosure is directed to the difference between the semiconductor device in FIG. 2C and the semiconductor device in FIG. 2A.

Referring to FIG. 2C, in the semiconductor device of the present embodiment, a pair of dielectric barrier layers 210 is respectively disposed in the substrate 200 under the gate structure 202 and between the source region 204 and the drain region 206. The dielectric barrier layers 210 are formed with the dielectric barrier layer 212c and the dielectric barrier layer 212b. The dielectric barrier layer 212c is formed with silicon oxide, for example, and the dielectric barrier layer 212b is formed with silicon nitride, for example. Further, the dielectric barrier layers 212c cover the spacer 220.

Figure 2D:
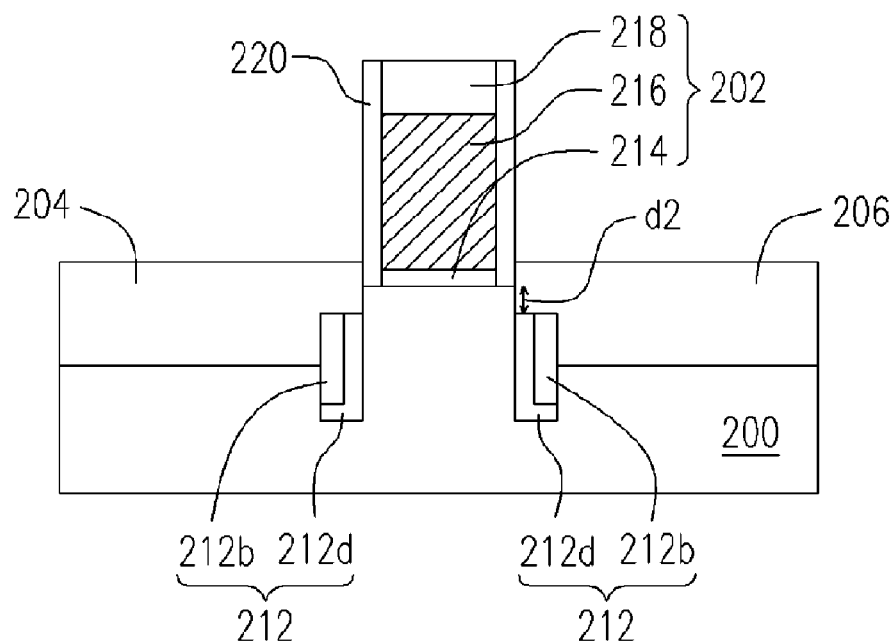
FIG. 2D is a schematic, cross-sectional diagram of a semiconductor device according to yet another embodiment of the present invention.

FIG. 2D is a schematic, cross-sectional diagram of a semiconductor device according to yet another embodiment of the present invention. In FIG. 2D, the same reference numbers are used to refer to the same parts in FIG. 2A.

Referring to FIG. 2D, in the semiconductor device of this embodiment, a pair of dielectric barrier layers 212 is respectively disposed beside both sides of the gate structure 202 in the substrate 200 between the source region 204 and the drain region 206. In this embodiment, the dielectric barrier layers are formed with the dielectric barrier layer 212d and the dielectric barrier layer 212b. The material of the dielectric barrier layer 212d includes silicon oxide; and the material of the dielectric barrier layer 212b includes silicon nitride. The dielectric barrier layer 212b is disposed between the dielectric barrier layer 212d and the source region 204 and between the dielectric barrier layer 212d and the drain region. The dielectric barrier layers 212 (includes the dielectric barrier layer 212d and the dielectric barrier layer 212b) and the gate structure 202 are separated by a distance d2. In other words, the channel region 208 and the source 204/drain 206 region of the semiconductor device is not completely blocked by the dielectric barrier layer 212, and the channel region 208 and the source 204/drain region 206 are connected through the gap between the gate structure 202 and the dielectric barrier layer 212.

In the semiconductor device of the present invention, a pair of dielectric barrier layers 212 is disposed between the source region 204 and the drain region, the electric field of the drain region is lowered to reduce the drain induced barrier lowering effect. Moreover, not only the present invention is precluded from forming a lightly doped region and a pocket implant region, the level of integration is increased. Additionally, with the gap between the gate structure and the dielectric barrier layer, the channel region and the source/drain region are connected together, and the operational voltage is thereby lowered.

The fabrication of the semiconductive device with the above-mentioned structure is described as follows. FIG. 3A through 3E are schematic cross-sectional views showing the steps for fabricating a semiconductor device according to an embodiment of the present invention.

Figure 3A:
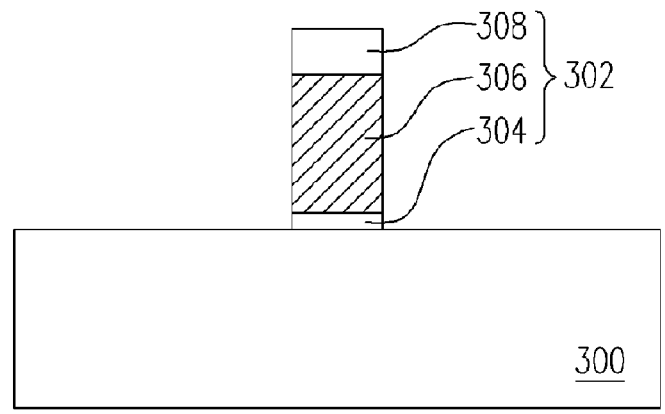
FIG. 3A through 3E are schematic, cross-sectional views showing the steps for fabricating a semiconductor device according to an embodiment of the present invention.

Referring to FIG. 3A, a substrate 300 is provided. The substrate 300 is a silicon substrate, for example. A gate structure 302 is formed over the substrate 300. The gate structure 302 is formed with, for example, a gate dielectric layer 304, a gate conductive layer 306 and a cap layer 308. The gate structure 302 is formed by, for example, forming sequentially on the substrate 300, a gate dielectric layer (not shown), a conductive material layer (not shown) and an insulation layer (not shown), followed by patterning the gate dielectric layer, the conductive material layer and the insulation layer. The material of the dielectric layer (gate dielectric layer 304) is silicon oxide, for example, which is formed by a method such as thermal oxidation. The conductive material layer (gate conductive layer 306) is fabricated with, for example, doped polysilicon, and this conductive material layer is fabricated by performing chemical vapor deposition to form an undoped polysilicon layer, followed by conducting ion implantation or in-situ dopant implantation in conjunction with chemical vapor deposition. The material of the insulation layer (cap layer 308) includes silicon nitride or silicon oxide. The insulation layer is formed by chemical vapor deposition, for example. The insulation layer (cap layer 308) can be a single layer structure or a multi-layer structure. In other words, the insulation layer (cap layer 308 can be a single layer of silicon oxide or silicon nitride, or a composite layer formed with silicon oxide and silicon nitride.

Figure 3B:
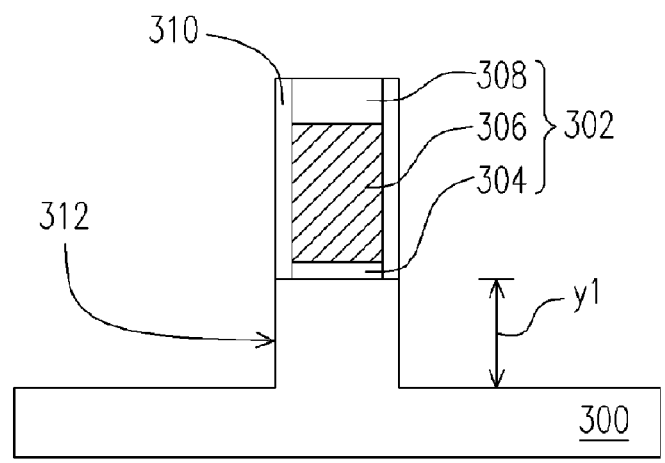

Referring to FIG. 3B, the sidewall of the gate structure 302 may include a spacer 310 thereon. The spacer 310 is formed by, for example, forming a layer of dielectric layer on the substrate 300. An anisotropic etching process or an etching-back process is then performed to remove a portion of the dielectric layer. The material of the dielectric layer (spacer 310) includes silicon oxide, silicon nitride or silicon oxynitride. The dielectric layer is formed by thermal oxidation or chemical vapor deposition. The dielectric layer (spacer 310) can be a single layer structure or a multi-layer structure. In other words, the dielectric layer (spacer 310) can be a single layer of silicon oxide or silicon nitride, or a composite layer of silicon oxide and silicon nitride.

Thereafter, a portion of the substrate 300 beside both sides of the gate structure 302 and the spacer 310 is removed using the gate structure 302 and the spacer 310 as a mask to form an opening 312 with a depth of y1 in the substrate 300. Removing the portion of the substrate 300 beside both sides of the gate structure 302 and the spacer 310 includes conducting a reactive ion etching (RIE) method.

Figure 3C:
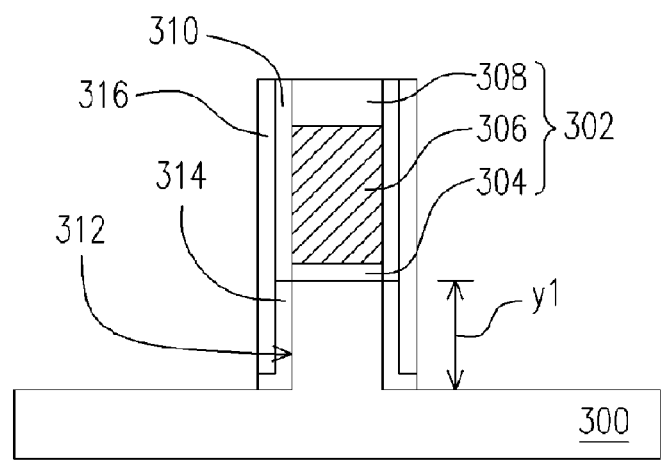

Referring to FIG. 3C, a dielectric barrier layer 314 is formed on the substrate 300 exposed by the opening 312. A dielectric barrier layer 316 is then formed on the sidewalls of the gate structure 302 and the substrate 300 underneath the gate 302. A material of the dielectric barrier layer 314 includes silicon oxide, and the thickness of the dielectric barrier layer 314 is about 5 angstroms to 100 angstroms. A material of the dielectric barrier layer 316 includes silicon nitride. The thickness of the dielectric barrier layer 316 is about 50 angstroms to 500 angstroms. The dielectric barrier layer 314 and the dielectric barrier layer 316 are formed by, for example, using thermal oxidation to form a dielectric material layer (silicon oxide layer) on the substrate 300 and performing chemical vapor deposition on the substrate 300 to form another dielectric material layer (silicon nitride layer) thereafter, followed by conducting an anisotropic etching process or an etching back process to remove a portion of the dielectric material layer (silicon nitride layer). After forming the dielectric barrier layer 316 on the sidewalls of the gate structure 302 and the substrate 300 underneath the gate structure 302, the dielectric material layer (silicon oxide layer) that is not covered by the dielectric barrier layer 316 is removed to form the dielectric barrier layer 314. In this embodiment, the anisotropic etching process or the etching back process can remove portions of the dielectric material layer (silicon oxide layer and silicon nitride layer) to form the dielectric barrier layer 314 and the dielectric barrier layer 316. The dielectric barrier layer 314 and the dielectric barrier layer 316 can be constituted with other dielectric materials, respectively.

Figure 3D:
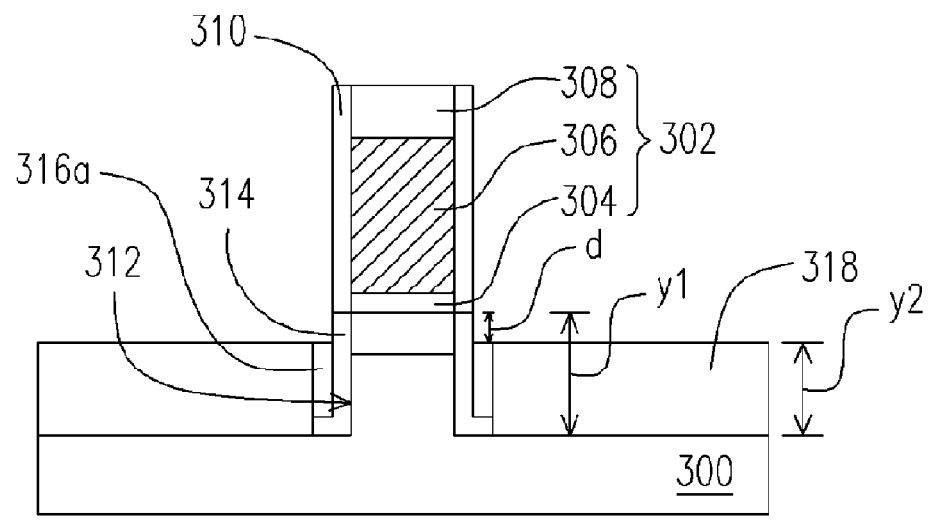

Continuing to FIG. 3D, a semiconductor layer 318 is formed in the opening 312. The semiconductor layer 318 has a thickness y2, wherein the thickness y2 is smaller than the depth of y1 of the opening 312. The semiconductor layer 318 is formed with epitaxial silicon with the same crystal orientation as the underlying silicon material. In this embodiment, the semiconductor layer 318 is formed on the exposed surface of the substrate 300.

Thereafter, a portion of the dielectric barrier layer 316 higher than the surface of the semiconductor layer 318 is removed, leaving behind the dielectric barrier layer 316a between the dielectric barrier layer 314 and the semiconductor layer 318. Removing the portion of the dielectric barrier layer 316 includes conducting a wet etching process. The distance between the dielectric barrier layer 316a and the gate structure 302 is "d".

Figure 3E:
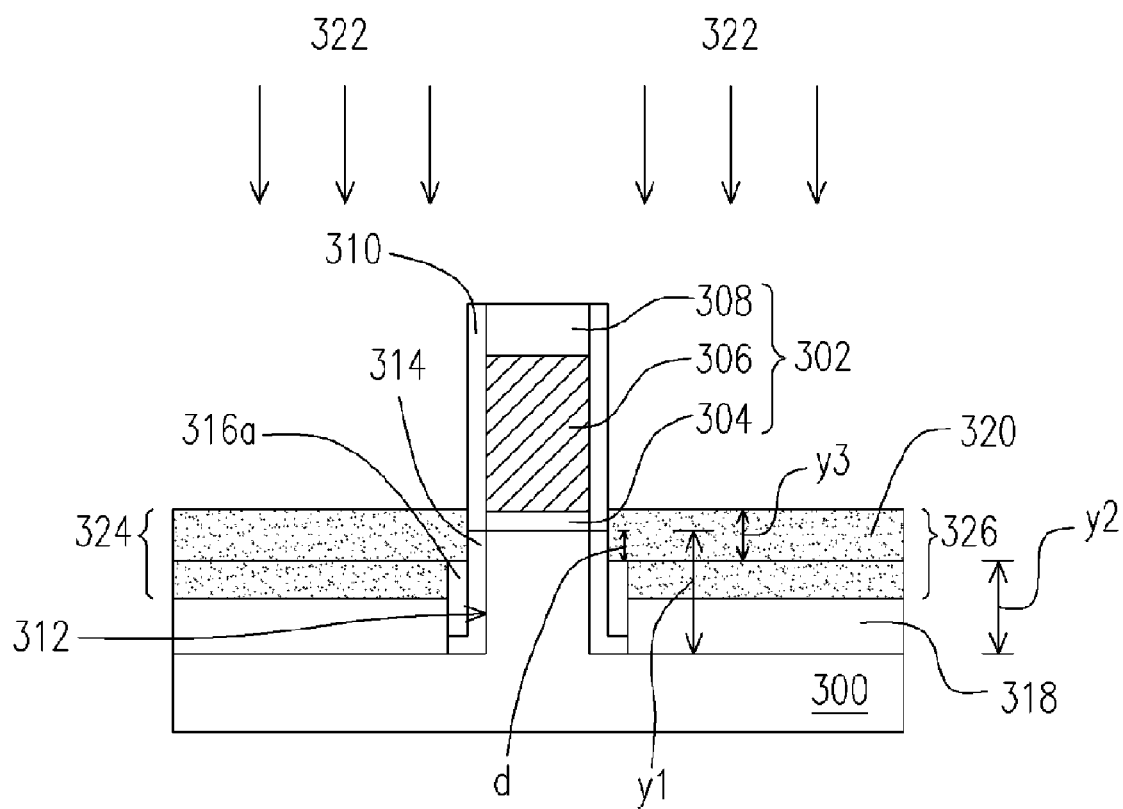

Referring to FIG. 3E, another layer of conductive layer 320 is formed in the opening 312. This conductive layer 320 has a thickness y3, wherein the sum of the thickness y3 and the thickness y2 is greater than the depth y1 of the opening 312. The conductive layer 320 is formed with, for example, epitaxial silicon, which is formed by selective epitaxial growing, in which the epitaxial silicon is selective grown on a silicon-containing surface. Further, the epitaxial silicon has the same crystal orientation as the underlying silicon material. In this embodiment, the conductive layer 320 is formed on the exposed surface of the semiconductor layer 318.

Thereafter, an ion implantation process 322 is conducted to form a source region 324 and a drain region 326 in the semiconductor layer 320 and the semiconductor layer 318 besides both sides of the gate structure 302. The subsequent semiconductor device process is well known to those skilled in the art and will not be reiterated herein.

In the fabrication method for a semiconductor device of the present invention, the dielectric barrier layer 314 and the dielectric barrier layer 316a are formed between the source region 324 and the drain region 326. Thus, the electric field of the drain region can be lower to reduce the short channel effect.

Further, in accordance with the fabrication method of the present invention, the formations of the lightly doped region and the pocket implant region are precluded. The level of integration can thereby increase and the present invention is suitable for the nanometer scale device.

Figure 4A:
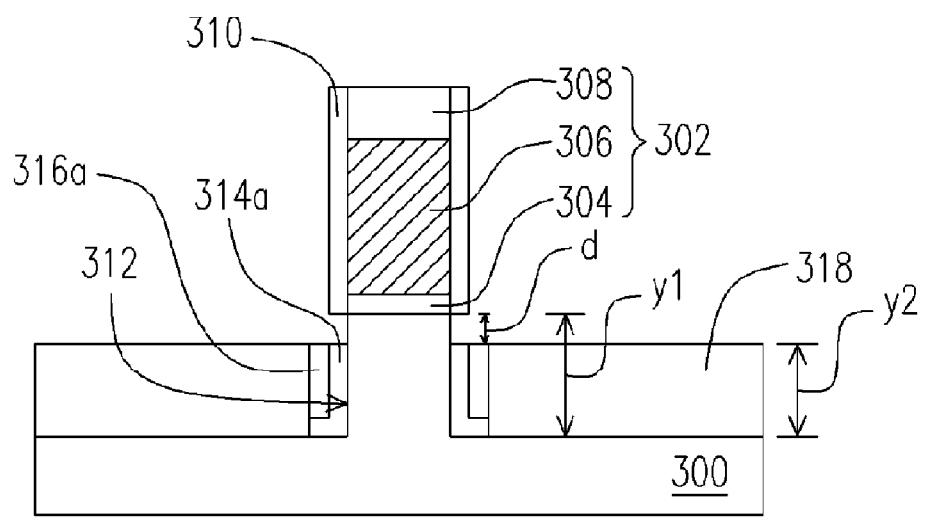
FIG. 4A through 4B are schematic, cross-sectional views showing the steps for fabricating a semiconductor device according to another embodiment of the present invention.
Figure 4B:
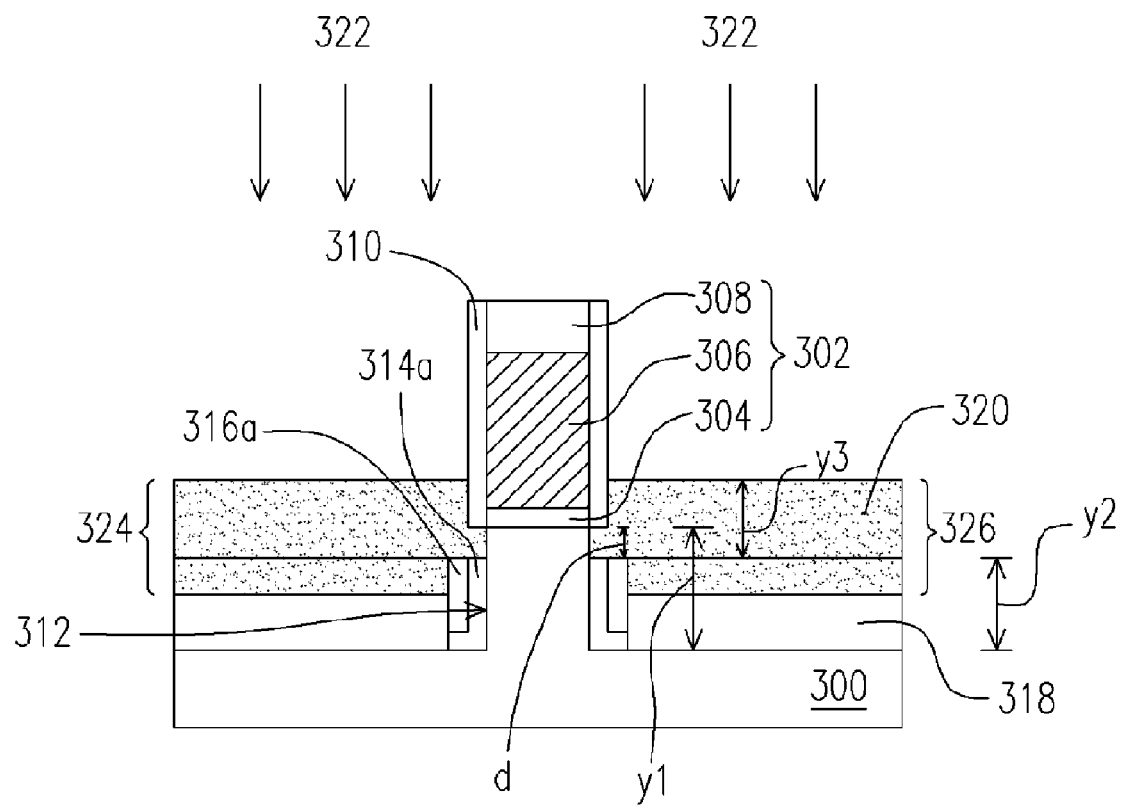

FIG. 4A through 4B are schematic cross-sectional views showing the steps for fabricating a semiconductor device according to another embodiment of the present invention. In FIGS. 4A and 4B, the same reference numbers are used to refer to the same parts in FIGS. 3A to 3C.

The process step illustrated in FIG. 4A is a continuation of that illustrated in FIG. 3C. Referring to FIG. 4A, an opening 312 is formed in a semiconductor layer 318. The thickness of the semiconductor layer is y2, wherein the thickness y2 is less than the depth y1 of the opening 312. The material of the semiconductor layer 318 includes epitaxial silicon, for example. The semiconductor layer is formed by, for example, selective epitaxial growing. The epitaxial silicon is selective grown on a silicon-containing surface. Further, the epitaxial silicon has the same crystal orientation as the underlying silicon material. In this embodiment, the conductive layer 318 is formed on the exposed surface of the substrate 300.

Thereafter, the portion of the dielectric barrier layer 316 higher than the surface of the semiconductor layer 318 is removed to leave behind the dielectric barrier layer 316a between the dielectric barrier layer 314 and the semiconductor layer 318. Removing the portion of the dielectric barrier layer 316 includes performing a wet etching process, such as using hot phosphoric acid as an etchant. The distance between the dielectric barrier layer 316a and the gate structure 302 is "d". Thereafter, a portion of the dielectric barrier layer 314 higher than the surface of the semiconductor layer 318 is further removed to form the dielectric barrier layer 314a between the dielectric barrier layer 316a and the substrate 300. The portion of the dielectric barrier layer 314 is removed by wet etching, for example, using hydroxyl acid as an etchant.

Continuing to FIG. 4B, another layer of semiconductor layer 320 is formed in the opening 312. The thickness of the semiconductor layer 320 is y3, wherein the sum of the thickness y3 and the thickness y2 is greater than the depth y1 of the opening 312. The material of the semiconductor layer 320 is, for example, epitaxial silicon, and the semiconductor layer 320 is formed by selective epitaxial growing, in which the epitaxial silicon is selective grown on a silicon-containing surface. Further, the epitaxial silicon has the same crystal orientation as the underlying silicon material. In this embodiment, the conductive layer 320 is formed on the exposed surface of the semiconductor layer 318.

An ion implantation process 322 is then performed to form a source region 324 and a drain region 326 in the semiconductor layer 320 and the semiconductor layer 318 beside both sides of the gate structure 302. The source region 324 and the drain region 326 are connected together through the gap between the dielectric barrier layers (314a & 316a) and the gate structure 302. The subsequent semiconductor device process is well known to those skilled in the art and will not be further reiterated herein.

In the fabrication method of a semiconductor device of the present invention, the dielectric barrier layer 314a and the dielectric barrier layer 316a are formed between the source region 324 and the drain region 326. The electric field of the drain region can be lowered to mitigate the short channel effect.

Further, in accordance to the fabrication method of the present invention, the formations of the lightly doped region and the pocket implant region are precluded. The level of integration can thereby increase and the present invention is suitable for the nanometer scale device.

Since a portion of the dielectric barrier layer 314 is further removed, the channel region and the source/drain region are connected together through the gap between the gate structure 302 and the dielectric barrier layer 314a (dielectric barrier layer 316a) to lower the operating voltage.

Figure 5A:
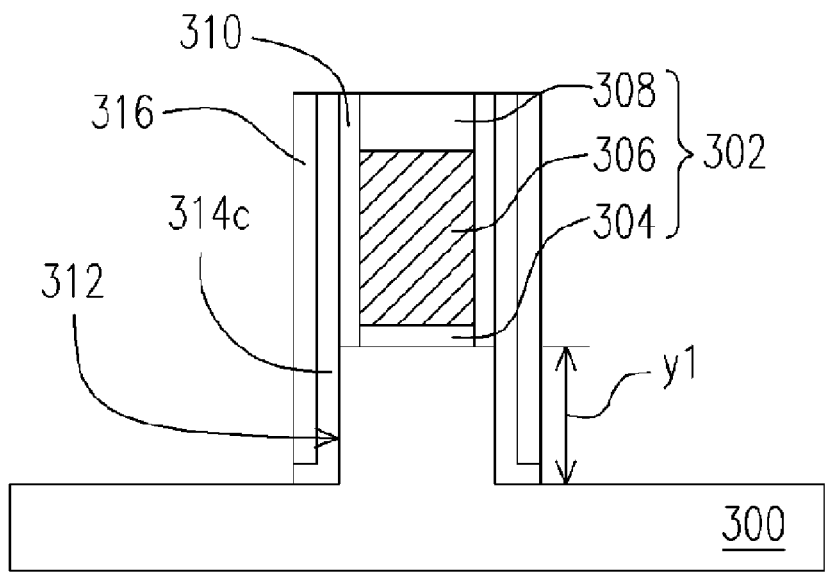
FIG. 5A through 5C are schematic cross-sectional views showing the steps for fabricating a semiconductor device according to still another embodiment of the present invention.
Figure 5B:
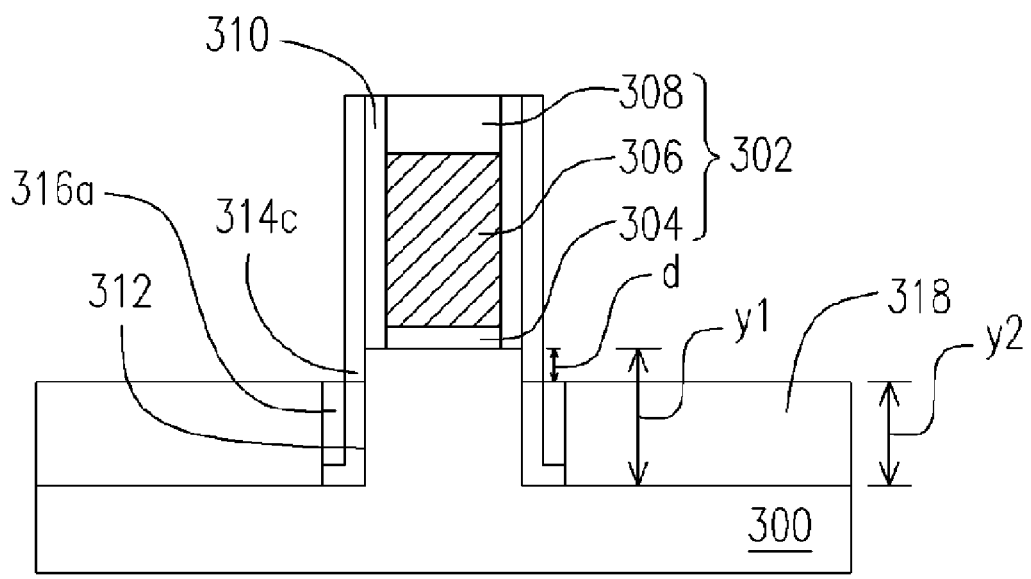
Figure 5C:
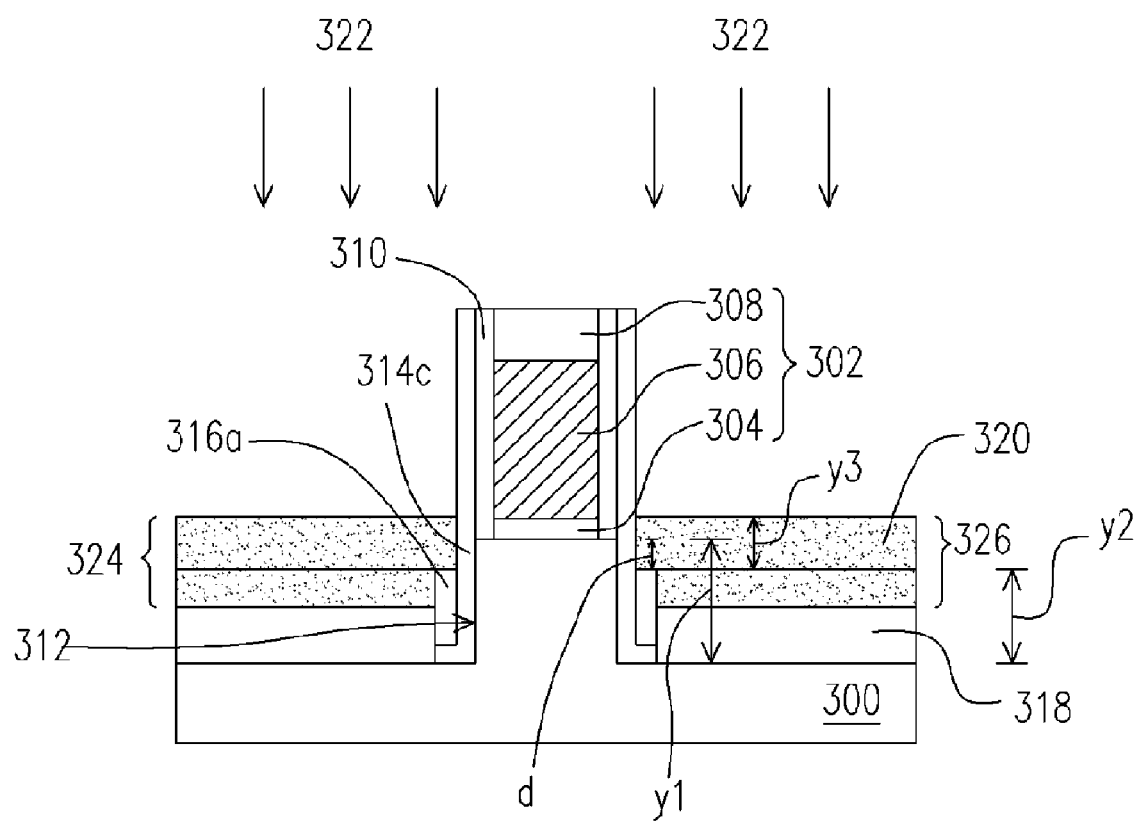

FIG. 5A through 5C are schematic cross-sectional views showing the steps for fabricating a semiconductor device according to still another embodiment of the present invention. In FIGS. 5A and 5C, the same reference numbers are used to refer to the same parts in FIGS. 3A to 3E.

The process step illustrated in FIG. 5A is a continuation of that illustrated in FIG. 3B. Referring to FIG. 5A, a dielectric barrier layer 314c and the dielectric barrier layer 316 are formed on the sidewalls of the gate structure 302 and the substrate 300 underneath the gate structure 302. The dielectric barrier layer 314c is formed with silicon oxide, for example, and the thickness of the dielectric barrier layer 314c is about 5 to 100 angstroms. The dielectric barrier layer 316 is formed with silicon nitride, for example, and the thickness of the dielectric barrier layer 316 is about 50 to 500 angstroms. The dielectric barrier layer 314c and the dielectric barrier layer 316 are formed by, for example, forming a dielectric material layer (silicon oxide layer) and another dielectric material layer (silicon nitride layer) sequentially on the substrate 300 using chemical vapor deposition, followed by conducting an anisotropic etching process or an etching back process to remove a portion of the dielectric material layer (silicon nitride layer and silicon oxide layer). Subsequent to the formation of the dielectric barrier layer 316 on the sidewalls of the gate structure 302 and the substrate underneath the gate structure 302, the dielectric materially layer (silicon oxide layer) not covered by the dielectric barrier layer 316 is removed to form the dielectric barrier layer 314c. The present embodiment also includes performing an anisotropic etching process or an etching back process to remove portions of both dielectric barrier layers 314c and 316 concurrently to form the dielectric barrier layer 314c and the dielectric barrier layer 316. The materials of the dielectric barrier layer 314c and the dielectric barrier layer 316 can be other dielectric materials.

Continuing to FIG. 5B, a semiconductor layer 318 is formed in the opening 312, wherein the thickness of the semiconductor layer 318 is y2 and the thickness y2 is less than the depth y1 of the opening 312. The material of the semiconductor layer 318 includes epitaxial silicon. The semiconductor layer 318 is formed by selective epitaxial growing in which the epitaxial silicon is selective grown on a silicon-containing surface. Further, the epitaxial silicon will have the same crystal orientation as the underlying silicon material. In this embodiment, the conductive layer 318 is formed on the exposed surface of the substrate 300.

A portion of the dielectric barrier layer 316 higher than the surface of the semiconductor layer 318 is removed to leave behind the dielectric barrier layer 316a between the dielectric barrier layer 314c and the semiconductor layer 318. Removing the portion of the dielectric barrier layer 316 includes performing a wet etching process. The distance between the dielectric barrier layer 316a and the gate structure 302 is d.

Continuing to FIG. 5c, a semiconductor layer 302 is formed in the opening 312. The thickness of the semiconductive layer 320 is y3, wherein the sum of the thickness y3 and the thickness y2 is greater than the depth y1 of the opening 312. The semiconductor layer 320 includes epitaxial silicon. The epitaxial silicon is formed by selective epitaxial growing in which the epitaxial silicon is grown selectively on a silicon-containing surface. Further, the epitaxial silicon has the same crystal orientation as the underlying silicon material. In this embodiment, the semiconductive layer 320 is formed on the exposed surface of the semiconductor layer 318.

Thereafter, an ion implantation process 322 is performed to form the source region 324 and the drain region 326 in the semiconductor layer 320 and the semiconductor layer 318 beside both sides of the gate structure 302. The subsequent semiconductor device process is well known to those skilled in the art and will not be further reiterated herein.

In the fabrication method for a semiconductor device of the present invention, the dielectric barrier layer 314c and the dielectric barrier layer 316a are formed between the source region 324 and the drain region 326. The electric field of the drain region is lowered to mitigate the short channel effect.

Further, in accordance with the fabrication method of the present invention, the formations of the lightly doped region and the pocket implant region are precluded. The level of integration can thereby increase and the present invention is suitable for the nanometer scale device.

Figure 6A:
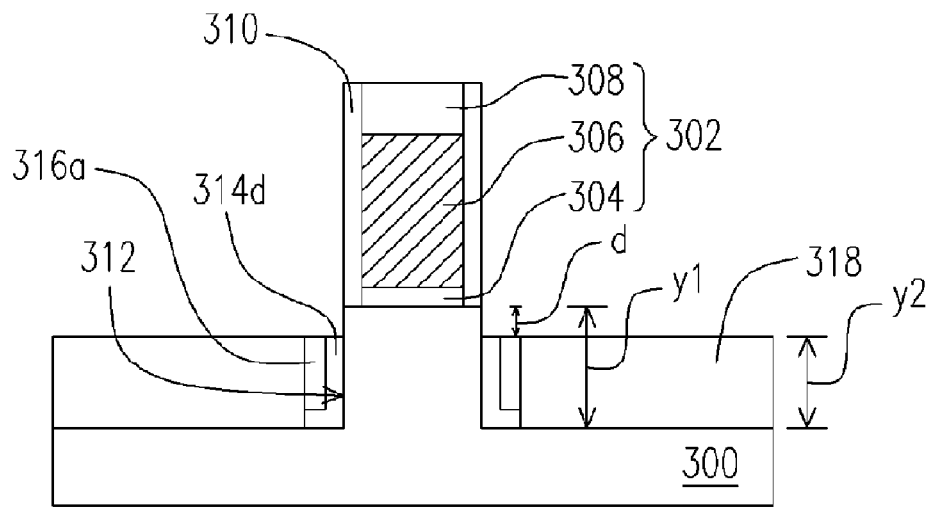
FIG. 6A through 6B are schematic cross-sectional views showing the steps for fabricating a semiconductor device according to yet another embodiment of the present invention.
Figure 6B:
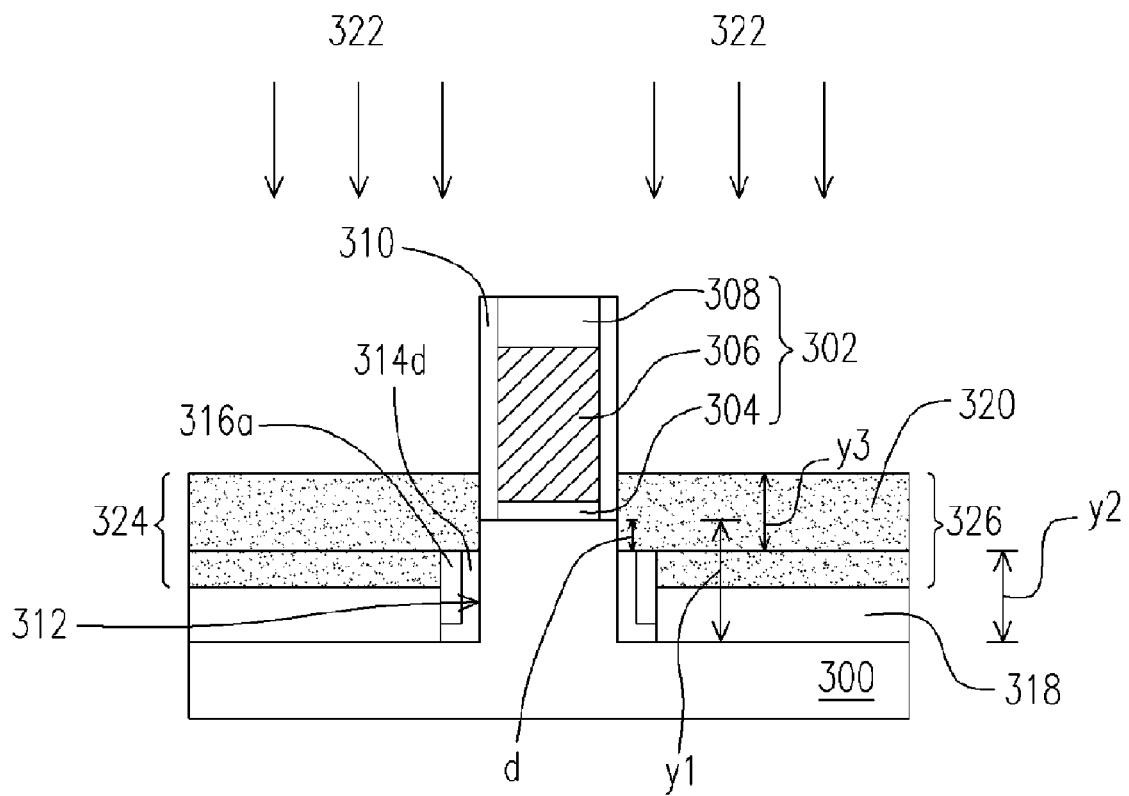

FIG. 6A through 6B are schematic cross-sectional views showing the steps for fabricating a semiconductor device according to yet another embodiment of the present invention. In FIGS. 6A and 6B, the same reference numbers are used to refer to the same parts in FIGS. 3A to 3E.

Referring to FIG. 6A which is a continuation of FIG. 5B, after forming the dielectric barrier layer 316a by removing the portion of the dielectric barrier layer 316 higher than the surface of the semiconductor layer 318, a portion of the dielectric barrier layer 314c higher than the surface of the semiconductor layer 318 is removed to leave behind the dielectric barrier layer 314d between the dielectric barrier layer 316a and the substrate 300. Removing the portion of the dielectric barrier layer 314c is accomplished by a wet etching process, using hydroxyl acid as an etchant, for example.

Continuing to FIG. 6B, another semiconductor layer 320 is formed in the opening 312, wherein the thickness of the semiconductor layer 320 is y3, wherein the sum of the thickness y3 and the thickness y2 is greater than the depth y1 of the opening 312. The material of the semiconductor layer 320 is epitaxial silicon, for example, and the semiconductor layer 320 is formed by selective epitaxial growing, for example. The epitaxial silicon is selective grown on a silicon-containing surface. Further, the epitaxial silicon has the same crystal orientation as the underlying silicon material. In this embodiment, the semiconductive layer 320 is formed on the exposed surface of the semiconductor layer 318.

An ion implantation process 322 is then performed to form a source region 324 and a drain region 326 in the semiconductor layer 320 and the semiconductor layer 318 beside both sides of the gate structure 302. The source region 324 and the drain region 326 are connected together through the gap between the dielectric barrier layer 314d and the gate structure 302. The subsequent semiconductor device process is well known to those skilled in the art and will not be further reiterated herein.

In the fabrication method of a semiconductor device of the present invention, the dielectric barrier layer 314d and the dielectric barrier layer 316a are formed between the source region 324 and the drain region 326. The electric field of the drain region can be lowered to mitigate the short channel effect.

Further, in accordance to the fabrication method of the present invention, the formations of the lightly doped region and the pocket implant region are precluded. The level of integration can thereby increase and the present invention is suitable for the nanometer scale device.

Moreover, a portion of the dielectric barrier layer 314c is further removed, the channel region is connected with the source/drain region through the gap between the gate structure 302 and the dielectric barrier layer 314d (dielectric barrier layer 316a) to lower the operating voltage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a semiconductor device comprising:
    providing a substrate;
    forming a gate structure on the substrate;
    removing a portion of the substrate, using the gate structure as a mask, to form an opening with a depth in the substrate beside both sides of the gate structure;
    forming a first dielectric barrier layer on the substrate exposed by the opening;
    forming a second dielectric barrier layer on sidewalls of the gate structure and the substrate underneath the gate structure;
    removing the first dielectric barrier layer not covered by the second dielectric barrier layer;
    forming a first semiconductive layer in the opening with a thickness, wherein the thickness is less than the depth;
    removing a portion of the second dielectric barrier layer higher than a surface of the first semiconductive layer;
    forming a second semiconductive layer in the opening; and
    forming a source region and a drain region in the second semiconductive layer and the first semiconductive layer beside both sides of the gate structure.

2. The method of claim 1, wherein after the step of removing the portion of the second dielectric barrier layer higher than the surface of the first semiconductive layer, the method further comprising removing a portion of the first dielectric barrier layer higher than a surface of the first semiconductive layer.

3. The method of claim 1, wherein a material of the first dielectric barrier layer comprises silicon oxide.

4. The method of claim 1, wherein the first dielectric barrier layer on the substrate exposed by the opening is formed by a thermal oxidation process or a chemical vapor deposition process.

5. The method of claim 1, wherein the step of forming the second dielectric barrier layer on sidewalls of the gate structure and the substrate underneath the gate structure comprises:
    forming a dielectric material layer on the substrate; and
    performing an anisotropic etching process to remove a portion of the dielectric material layer.

6. The method of claim 1, wherein a material of the second dielectric barrier layer comprises silicon nitride.

7. The method of claim 1, wherein a material of the first semiconductive layer and the second semiconductive layer comprises epitaxial silicon.

8. The method of claim 6, wherein a method of forming the first semiconductive layer and the second semiconductive layer comprises selective epitaxial growing.

* * * * *